United States Patent
Lee (10) Patent No.: US 9,444,165 B2
(45) Date of Patent: Sep. 13, 2016

(54) PIN ARRANGEMENT AND ELECTRONIC ASSEMBLY

(71) Applicant: VIA Technologies, Inc., New Taipei (TW)

(72) Inventor: Sheng-Yuan Lee, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 66 days.

(21) Appl. No.: 14/551,094

(22) Filed: Nov. 24, 2014

(65) Prior Publication Data

US 2016/0079694 A1    Mar. 17, 2016

Related U.S. Application Data (60) Provisional application No. 62/051,259, filed on Sep. 16, 2014.

(51) Int. Cl.
| | |
|---|---|
| *H01R 12/00* | (2006.01) |
| *H01R 12/77* | (2011.01) |
| *H05K 1/02* | (2006.01) |
| *H05K 1/14* | (2006.01) |

(Continued)

(52) U.S. Cl.
CPC ........ *H01R 12/771* (2013.01); *H01R 13/6473* (2013.01); *H05K 1/025* (2013.01); *H05K 1/118* (2013.01); *H05K 1/147* (2013.01); *H01R 13/6471* (2013.01); *H05K 1/117* (2013.01); *H05K 2201/09781* (2013.01); *H05K 2201/10189* (2013.01)

(58) Field of Classification Search
CPC .................................................. H01R 13/6471
USPC .......................................................... 439/67
See application file for complete search history.

(56) References Cited

U.S. PATENT DOCUMENTS

| | | |
|---|---|---|
| 6,445,590 B1 | 9/2002 | Dow |
| 6,721,189 B1 * | 4/2004 | Haba .................... H01R 12/714 174/254 |

(Continued)

FOREIGN PATENT DOCUMENTS

| | | |
|---|---|---|
| EP | 1901593 | 3/2008 |
| EP | 2739125 | 6/2014 |

OTHER PUBLICATIONS

"Search Report of Europe Counterpart Application", issued on Mar. 2, 2016, p. 1-p. 2.

(Continued)

*Primary Examiner* — Tho D Ta
(74) *Attorney, Agent, or Firm* — Jianq Chyun IP Office (57) ABSTRACT

A pin arrangement adapted to a FPC connector is provided. The pin arrangement includes a pin lane. The pin lane includes a pair of ground pins, a pair of differential pins and at least one not-connected (NC) pin. The differential pins are located between the pair of ground pins. The at least one NC pin is located between the pair of differential pins or between one of the pair of ground pins and one of the pair of differential pins adjacent thereto. By adding the at least one NC pin between the pair of differential pins and/or between the differential pin and the ground pin adjacent thereto, a distance between each of the pair of the differential pins and/or between the differential pin and the ground pin is increased, and thus a differential characteristic impedance of the pair of differential pins is raised to reduce the impact of impedance mismatch.

18 Claims, 9 Drawing Sheets

(51) Int. Cl.
*H01R 13/6473* (2011.01)
*H01R 13/6471* (2011.01)
*H05K 1/11* (2006.01)

(56) References Cited

U.S. PATENT DOCUMENTS

| | | | | |
|---|---|---|---|---|
| 6,867,993 | B2* | 3/2005 | Ohshima | G11C 5/066 |
| | | | | 365/201 |
| 7,708,564 | B2* | 5/2010 | Fogg | H05K 1/0231 |
| | | | | 174/261 |
| 2006/0113109 | A1 | 6/2006 | Koga | |
| 2008/0062666 | A1 | 3/2008 | Lim et al. | |
| 2009/0263140 | A1 | 10/2009 | Kagaya | |
| 2014/0002935 | A1* | 1/2014 | Chen | H05K 1/0245 |
| | | | | 361/56 |
| 2014/0178014 | A1* | 6/2014 | Flens | G02B 6/43 |
| | | | | 385/88 |
| 2014/0206240 | A1 | 7/2014 | Schumacher et al. | |
| 2014/0357105 | A1* | 12/2014 | Wig | H05K 1/0216 |
| | | | | 439/81 |

OTHER PUBLICATIONS

"Office Action of Taiwan Counterpart Application", issued on Mar. 10, 2016, p. 1-p. 12.

* cited by examiner

PIN ARRANGEMENT AND ELECTRONIC ASSEMBLY

CROSS-REFERENCE TO RELATED APPLICATION

This application claims the priority benefits of U.S. provisional application Ser. No. 62/051,259, filed on Sep. 16, 2014. The entirety of the above-mentioned patent application is hereby incorporated by reference herein and made a part of this specification.

BACKGROUND

1. Technical Field

The invention relates to an electronic device, and particularly relates to a pin arrangement adapted to a flexible printed circuit (FPC) connector and an electronic assembly using the same.

2. Related Art

Since a flexible printed circuit (FPC) has advantages of flexibility and space-saving, the FPC is usually applied to foldable electronic devices, for example, docking stations of notebook computers and tablet computers. In design and a manufacturing process, a width and a thickness of a trace of the FPC can be adjusted to change a magnitude of an impedance thereof, so that impedance control can be performed on the FPC. Since the FPC is a universal interconnection, a FPC connector used for clamping the FPC is also designed to be universal, such that the impedance control is not performed on the FPC connector.

In some applications, for example, in signal transmission of USB 3.0 within the electronic device, the FPC can be used to replace a general cable to implement the signal transmission. Since the interconnection is provided within the electronic device, besides that the same FPC is applied to the USB 3.0, it is simultaneously applied to other types of signals and power supply (for example, PCIE, HDMI, VCC, control signal, etc.), so as to reduce a device cost and miniaturize a device appearance. However, the higher an operation frequency of a communication standard (for example, USB, SATA, HDMI, PCIE, or DP (displayport), etc.) applied in the electronic device is, the more impact of an impedance mismatch occurred on the FPC is, which obviously influences a performance of the electronic device. The impact of impedance mismatch may cause malfunction of the electronic device or aggravate compatibility thereof.

SUMMARY

The invention is directed to a pin arrangement, which is adapted to a flexible printed circuit (FPC) connector to reduce impedance mismatch.

The invention is directed to an electronic assembly, in which a FPC connector is capable of reducing the impact of impedance mismatch.

The invention provides a pin arrangement adapted to a FPC connector. The pin arrangement includes a pin lane. The pin lane includes a pair of ground pins, a pair of differential pins and at least one middle not-connected (NC) pin. The pair of differential pins is located between the pair of ground pins. The at least one middle NC pin is located between the pair of differential pins.

The invention provides an electronic assembly including two printed circuit boards (PCBs), two FPC connectors, and a FPC. The FPC connectors are respectively mounted on the PCBs. The FPC has two contact portions respectively connected to the FPC connectors, so as to electrically connect the FPC connectors. Each of the FPC connectors has a pin arrangement, and the pin arrangement includes a pin lane, and the pin lane includes a pair of ground pins, a pair of differential pins and at least one middle not-connected (NC) pin. The pair of differential pins is located between the pair of ground pins. The at least one middle NC pin is located between the pair of differential pins.

The invention provides a pin arrangement adapted to a FPC connector. The pin arrangement includes a pin lane. The pin lane includes a pair of ground pins, a pair of differential pins and at least one not-connected (NC) pin. The pair of differential pins is located between the pair of ground pins. The NC pin is located between the pair of differential pins. Alternatively, the NC pin is located between one of the pair of ground pins and one of the pair of differential pins adjacent thereto.

According to the above descriptions, in the invention, the at least one of NC pins is added between the pair of differential pins and/or between the differential pin and the ground pin adjacent thereto so as to increase a distance between each of the pair of the differential pins and/or between the differential pin and the ground pin, and thus a differential characteristic impedance of the pair of differential pins may be improved to reduce the impact of impedance mismatch.

In order to make the aforementioned and other features and advantages of the invention comprehensible, several exemplary embodiments accompanied with figures are described in detail below.

DETAILED DESCRIPTION OF DISCLOSED EMBODIMENTS

Figure 1:
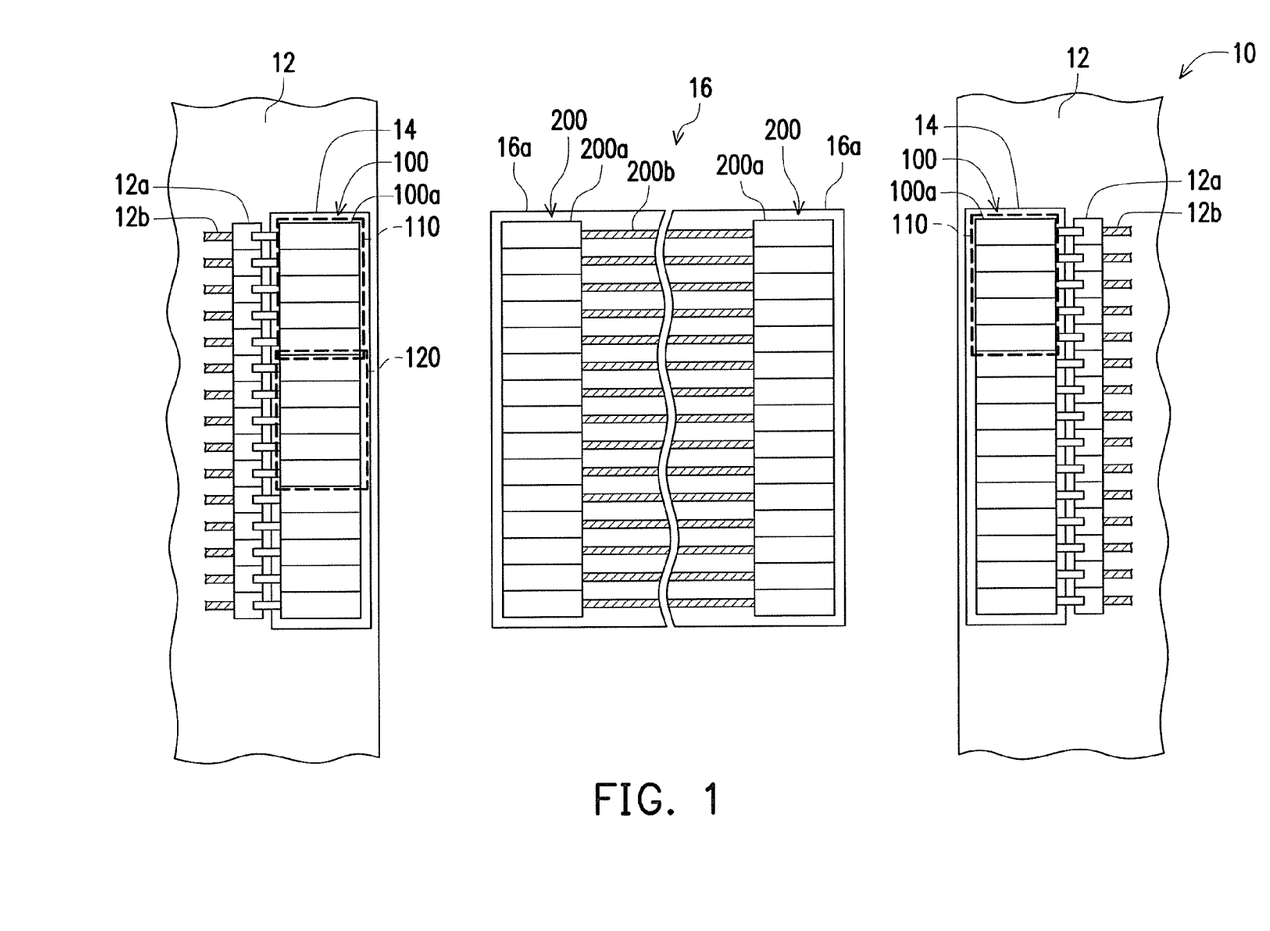
FIG. 1 is a schematic diagram of an electronic assembly according to an embodiment of the invention.

Referring to FIG. 1, in the present embodiment, an electronic assembly 10 can be applied to an electronic device, for example, a docking station of a notebook computer or a tablet computer. The electronic assembly 10 includes two printed circuit boards (PCBs) 12, two flexible printed circuit (FPC) connectors 14, and a FPC 16. The FPC connectors 14 are respectively mounted on the PCBs 12. The FPC 16 has two contact portions 16a, and the two contact portions 16a respectively connected to the FPC connectors 14. Therefore, by electrically connecting the FPC connectors 14 and the FPC 16, the PCBs 12 are electrically connected to each other. Therefore, the FPC 16 (for example, a path and a section area of a lead, etc.) can be customized according to positions of the PCBs 12, so as to increase space design flexibility.

In order to ensure transmission quality of high speed signal, differential pair is a commonly used signal transmission method, and a dual signal path is used to implement the signal transmission. Therefore, some communication standards (for example, USB, SATA, HDMI, PCIE, DP, etc.) adopt the differential pair to transmit important signals. In following embodiments, USB 3.0 is taken as an example for simulation, though the invention is not limited thereto, and other current and future USB communication standards and other types of communication standards can also be applied.

Referring to FIG. 1, each of the FPC connectors 14 has pin arrangement 100, which is composed of a plurality of pins 100a substantially arranged in a line, and is used for connecting a pad arrangement 200 of the contact portion 16a of the FPC 16. The pad arrangement 200 is composed of a plurality of FPC pads 200a substantially arranged in a line. In an actual application, the pins 100a of the FPC connector 14 substantially have the same pitch there between.

Figure 2:
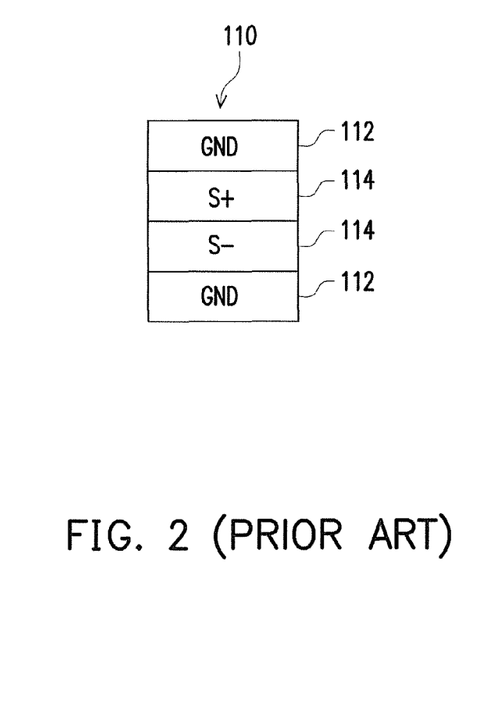
FIG. 2 is a schematic diagram of a conventional pin arrangement adopted by a pin arrangement of FIG. 1.

In the conventional technique, as shown in FIG. 2, the pin arrangement 100 includes a pin lane 110, which is used for transmitting a signal differential pair. The pin lane 110 includes a pair of ground pins 112 and a pair of differential pins 114. The pair of differential pins 114 is located between the pair of ground pins 112, and there is no pin between the pair of differential pins 114, or/and between the pair of ground pins 112 and the pair of differential pins 114. However, regarding the conventional pin lane 110 of FIG. 2, a capacitive coupling effect generated by the pair of differential pins 114 with reference of the pair of ground pins 112 greatly decreases a differential characteristic impedance of the pair of differential pins 114, which causes the impact of impedance mismatch.

Figure 3A:
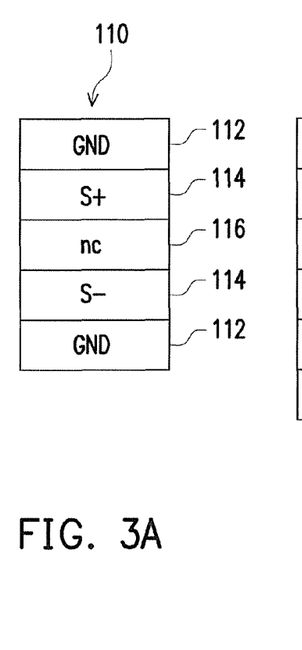
FIG. 3A is a schematic diagram of a pin arrangement according to an embodiment of the invention adopted by a pin arrangement of FIG. 1.
Figure 3B:
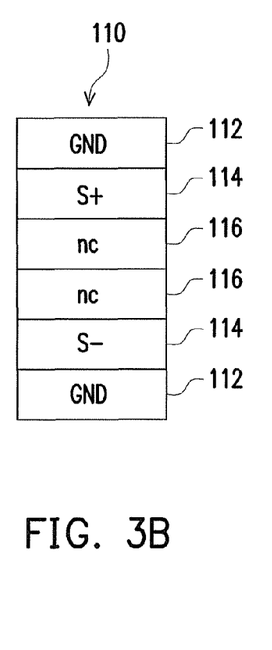
FIG. 3B is a schematic diagram of a pin arrangement according to another embodiment of the invention adopted by a pin arrangement of FIG. 1.
Figure 3C:
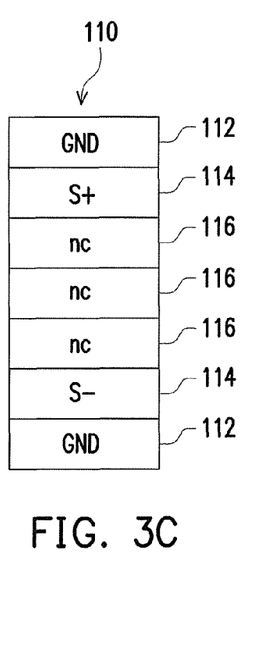
FIG. 3C is a schematic diagram of a pin arrangement according to another embodiment of the invention adopted by a pin arrangement of FIG. 1.

Referring to FIG. 3A to FIG. 3C, in order to increase the differential characteristic impedance of the pin lane 110, compared to the conventional pin lane 110 of FIG. 2, in the embodiments of FIG. 3A to FIG. 3C, the pin lane 110 may include one or a plurality of middle not-connected (NC) pins 116, which is/are located between the pair of differential pins 114. Therefore, by adding the middle NC pins 116, a distance between each of the differential pins 114 is increased, so as to increase the differential characteristic impedance of the pair of differential pins 114 to reduce the impact of impedance mismatch. Therefore, the more middle NC pins 116 are, the less impact of impedance mismatch is.

Figure 4A:
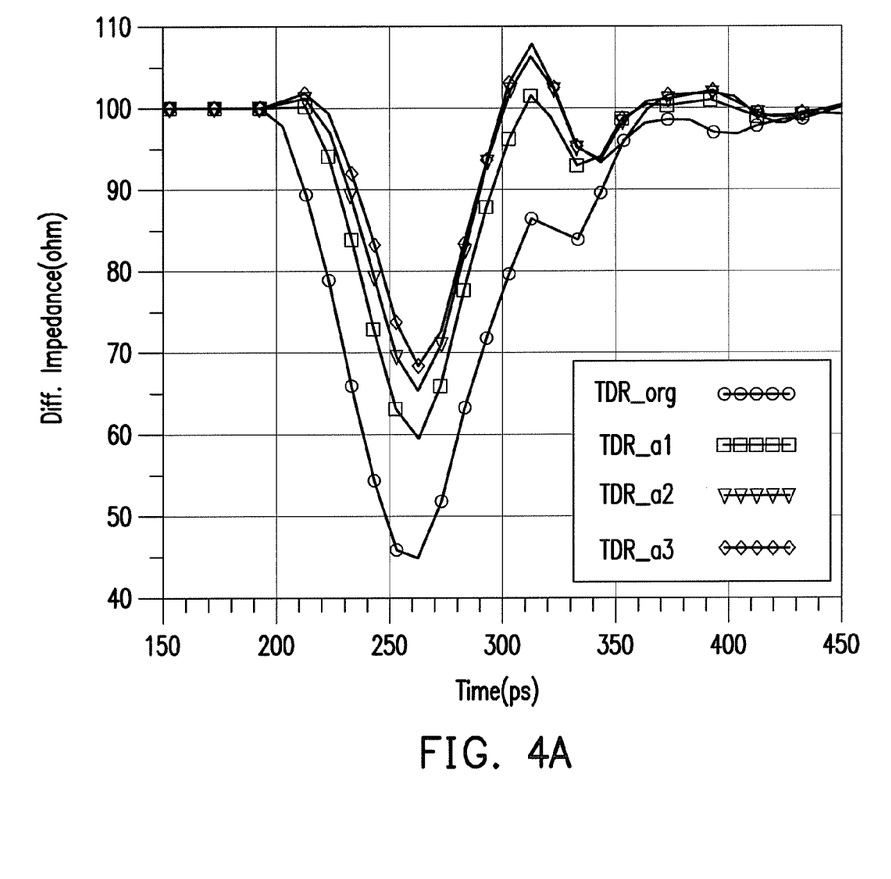
FIG. 4A illustrates a time domain reflectometry (TDR) comparison of the pin arrangements of FIG. 2 and FIGS. 3A-3C.

Referring to FIG. 4A, according to a simulation result of time domain reflectometry (TDR), a curve of the conventional pin lane 110 of FIG. 2 is a curve TDR_org, a curve of the pin lane 110 of the embodiment of FIG. 3A is a curve TDR_a1, a curve of the pin lane 110 of the embodiment of FIG. 3B is a curve TDR_a2, and a curve of the pin lane 110 of the embodiment of FIG. 3C is a curve TDR_a3. Compared to the differential characteristic impedance (for example, around 45 ohm) of the curve TDR_org of the conventional pin lane 110 of FIG. 2, the curves TDR_a1, TDR_a2 and TDR_a3 of the pin lane 110 of the embodiments of FIG. 3A to FIG. 3C all have higher differential characteristic impedance (for example, around 60~70 ohm), such that the transmission quality of the signal differential pair is increased.

Figure 4B:
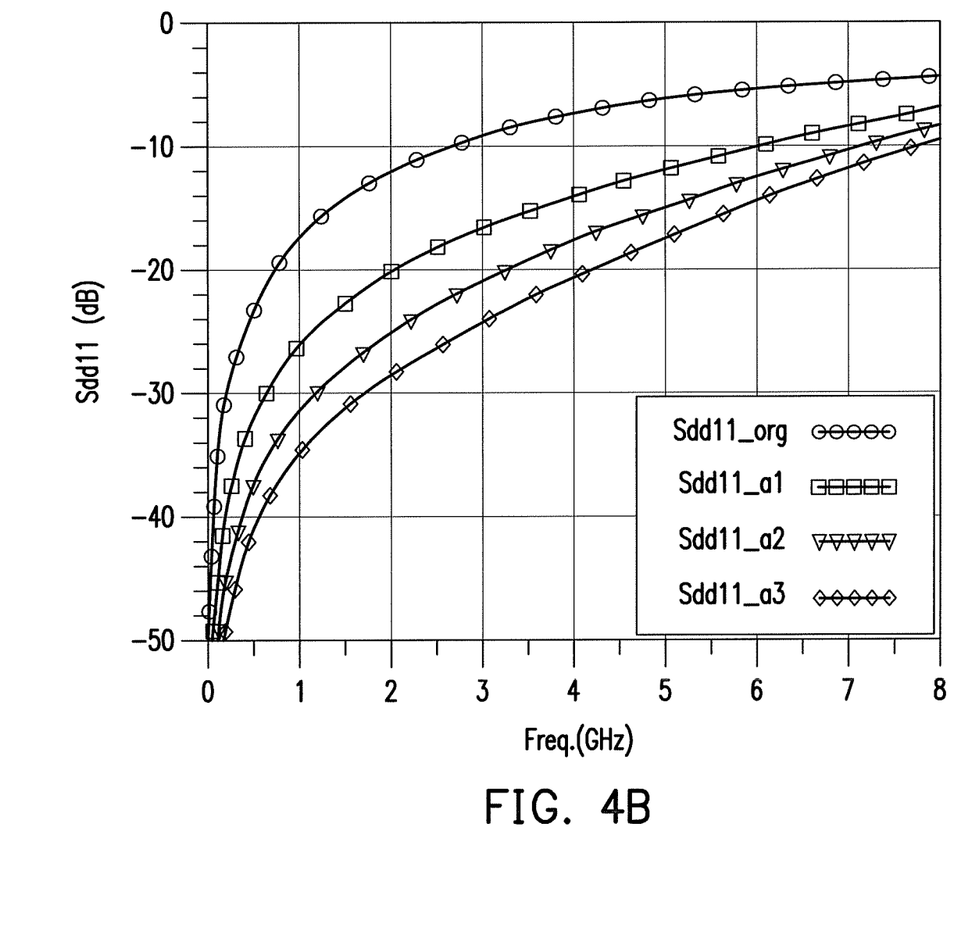
FIG. 4B illustrates a return loss comparison of the pin arrangements of FIG. 2 and FIGS. 3A-3C.

Referring to FIG. 4B, according to a simulation result of return loss, a curve of the conventional pin lane 110 of FIG. 2 is a curve Sdd11_org, a curve of the pin lane 110 of the embodiment of FIG. 3A is a curve Sdd11_a1, a curve of the pin lane 110 of the embodiment of FIG. 3B is a curve Sdd11_a2, and a curve of the pin lane 110 of the embodiment of FIG. 3C is a curve Sdd11_a3. Compared to the curve Sdd11_org of the conventional pin lane 110 of FIG. 2, the curves Sdd11_a1, Sdd11_a2 and Sdd11_a3 of the pin lane 110 of the embodiments of FIG. 3A to FIG. 3C all have better return loss (for example, their curves Sdd11 are closed to −50 dB), such that the transmission quality of the signal differential pair is increased.

Figure 4C:
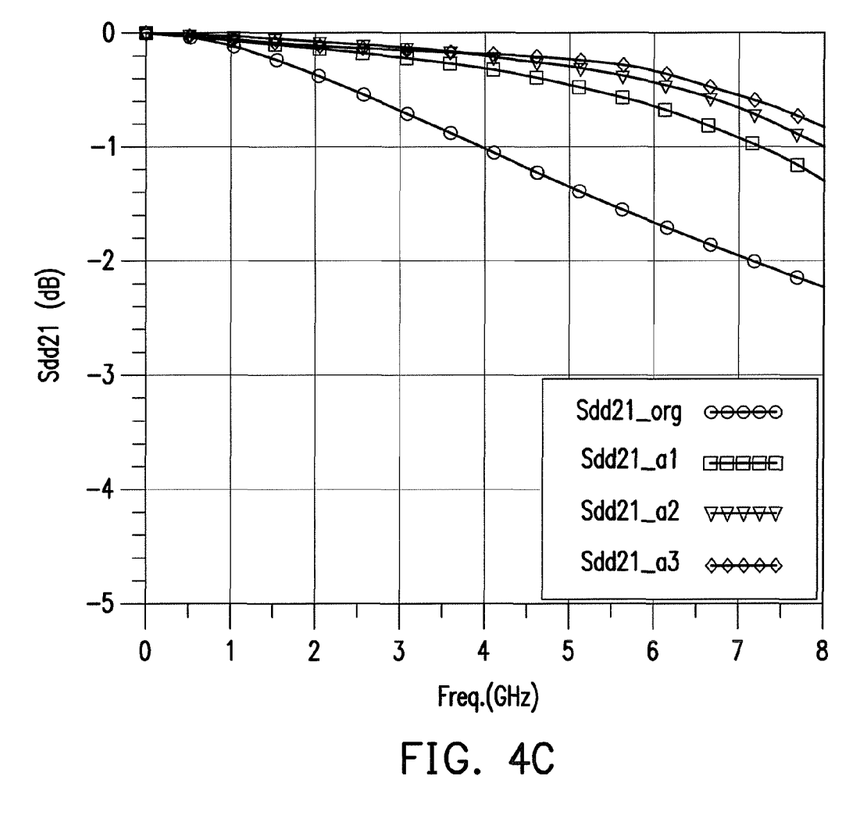
FIG. 4C illustrates an insertion loss comparison of the pin arrangements of FIG. 2 and FIGS. 3A-3C.

Referring to FIG. 4C, according to a simulation result of insertion loss, a curve of the conventional pin lane 110 of FIG. 2 is a curve Sdd21_org, a curve of the pin lane 110 of the embodiment of FIG. 3A is a curve Sdd21_a1, a curve of the pin lane 110 of the embodiment of FIG. 3B is a curve Sdd21_a2, and a curve of the pin lane 110 of the embodiment of FIG. 3C is a curve Sdd21_a3. Compared to the curve Sdd21_org of the conventional pin lane 110 of FIG. 2, the curves Sdd21_a1, Sdd21_a2 and Sdd21_a3 of the pin lane 110 of the embodiments of FIG. 3A to FIG. 3C all have smaller insertion loss (for example, their curves Sdd21 are closed to 0 dB), such that the transmission quality of the signal differential pair is increased.

Figure 5A:
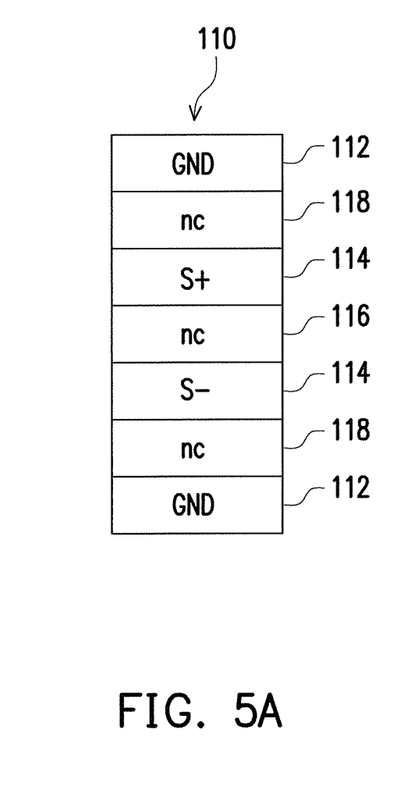
FIG. 5A is a schematic diagram of a pin arrangement according to another embodiment of the invention adopted by a pin arrangement of FIG. 1.
Figure 5B:
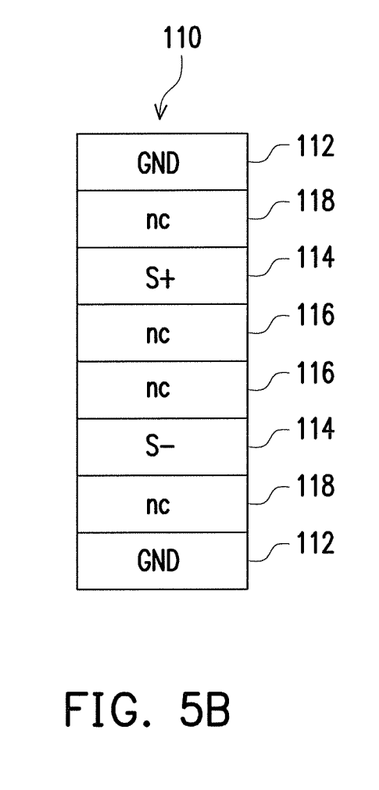
FIG. 5B is a schematic diagram of a pin arrangement according to another embodiment of the invention adopted by a pin arrangement of FIG. 1.
Figure 5C:
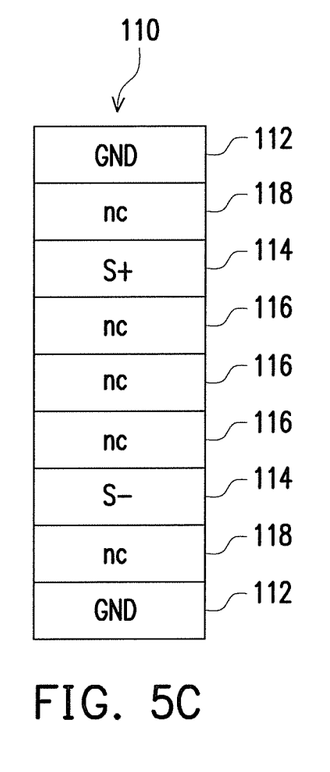
FIG. 5C is a schematic diagram of a pin arrangement according to another embodiment of the invention adopted by a pin arrangement of FIG. 1.

Referring to FIG. 5A to FIG. 5C, in order to increase the differential characteristic impedance of the pin lane 110, compared to the pin lane 110 of the embodiments of FIG. 3A to FIG. 3C, in the embodiments of FIG. 5A to FIG. 5C, the pin lane 110 may further includes a pair of side not-connected (NC) pins 118, which are respectively located between the pair of ground pins 112 and the pair of differential pins 114. In detail, one of the pair of side not-connected (NC) pins 118 is located between one of the pair of ground pins 112 and one of the pair of differential pins 114 adjacent thereto; while the other of a pair of side not-connected (NC) pins 118 is located between the other of the pair of ground pins 112 and the other of the pair of differential pins 114 adjacent thereto. Therefore, by adding the side NC pins 118, the distance between the differential pin 114 and the ground pin 112 is increased, so as to increase the differential characteristic impedance of the pair of differential pins 114 to reduce the impact of impedance mismatch.

Figure 6A:
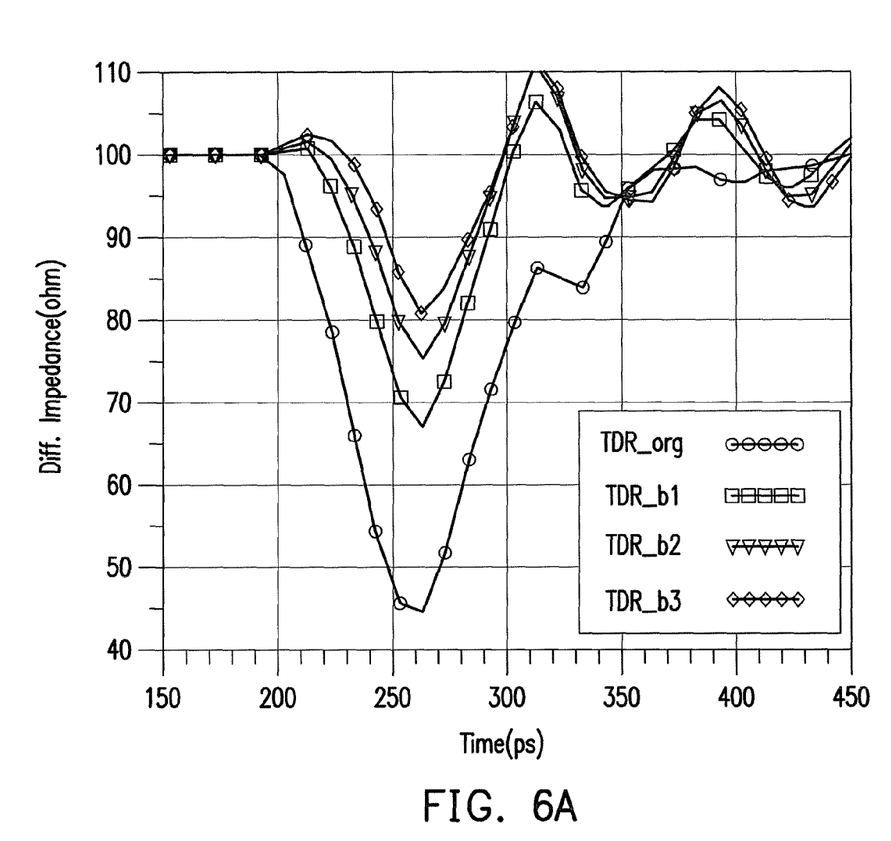
FIG. 6A illustrates a time domain reflectometry (TDR) comparison of the pin arrangements of FIG. 2 and FIGS. 5A-5C.

Referring to FIG. 6A, according to a simulation result of time domain reflectometry (TDR), a curve of the conventional pin lane 110 of FIG. 2 is a curve TDR_org, a curve of the pin lane 110 of the embodiment of FIG. 5A is a curve TDR_b1, a curve of the pin lane 110 of the embodiment of FIG. 5B is a curve TDR_b2, and a curve of the pin lane 110 of the embodiment of FIG. 5C is a curve TDR_b3. Compared to the differential characteristic impedance (for example, around 45 ohm) of the curve TDR_org of the conventional pin lane 110 of FIG. 2, the curves TDR_b1, TDR_b2 and TDR_b3 of the pin lane 110 of the embodiments of FIG. 5A to FIG. 5C all have higher differential characteristic impedance (for example, around 70~80 ohm), such that the transmission quality of the signal differential pair is increased.

Figure 6B:
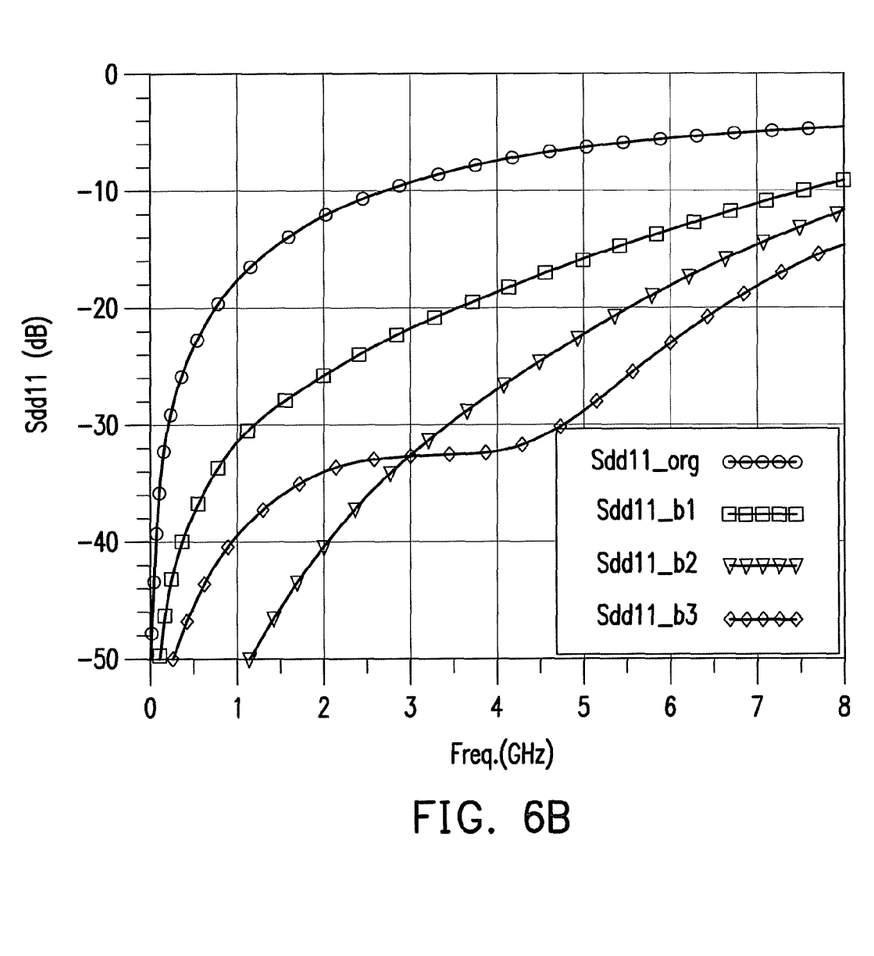
FIG. 6B illustrates a return loss comparison of the pin arrangements of FIG. 2 and FIGS. 5A-5C.

Referring to FIG. 6B, according to a simulation result of return loss, a curve of the conventional pin lane 110 of FIG. 2 is a curve Sdd11_org, a curve of the pin lane 110 of the embodiment of FIG. 5A is a curve Sdd11_b1, a curve of the pin lane 110 of the embodiment of FIG. 5B is a curve Sdd11_b2, and a curve of the pin lane 110 of the embodiment of FIG. 5C is a curve Sdd11_b3. Compared to the curve Sdd11_org of the conventional pin lane 110 of FIG. 2, the curves Sdd11_b1, Sdd11_b2 and Sdd11_b3 of the pin lane 110 of the embodiments of FIG. 5A to FIG. 5C all have better return loss (for example, their curves Sdd11 are closed to −50 dB), such that the transmission quality of the signal differential pair is increased.

Figure 6C:
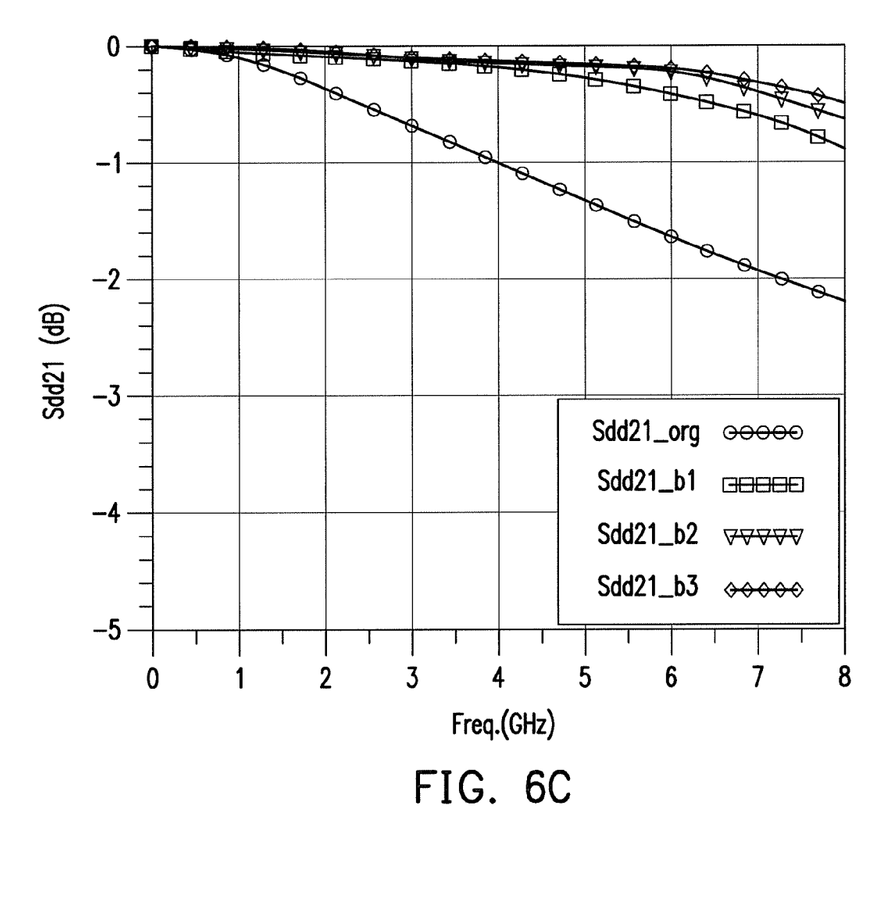
FIG. 6C illustrates an insertion loss comparison of the pin arrangements of FIG. 2 and FIGS. 5A-5C.

Referring to FIG. 6C, according to a simulation result of insertion loss, a curve of the conventional pin lane 110 of FIG. 2 is a curve Sdd21_org, a curve of the pin lane 110 of the embodiment of FIG. 5A is a curve Sdd21_b1, a curve of the pin lane 110 of the embodiment of FIG. 5B is a curve Sdd21_b2, and a curve of the pin lane 110 of the embodiment of FIG. 5C is a curve Sdd21_b3. Compared to the curve Sdd21_org of the conventional pin lane 110 of FIG. 2, the curves Sdd21_b1, Sdd21_b2 and Sdd21_b3 of the pin lane 110 of the embodiments of FIG. 5A to FIG. 5C all have smaller insertion loss (for example, their curves Sdd21 are closed to 0 dB), such that the transmission quality of the signal differential pair is increased.

Back to referring to FIG. 1, in the present embodiment, the pin arrangement 100 may further include another pin lane 120, which is used for transmitting another signal differential pair, for example adopt to USB, SATA, HDMI, PCIE, DP, etc. It should be noticed that the pin lane 120 and the pin lane 110 shown in FIGS. 3A-3C and FIGS. 5A-5C may have the same or different type and arrangement. It means the pin lane 120 or the pin lane 110 may has one of types and arrangements shown in FIGS. 3A-3C and FIGS. 5A-5C.

Referring to FIG. 1, in the present embodiment, the PCB 12 has a plurality of PCB pads 12a and a plurality of PCB traces 12b. The PCB pads 12a connecting to the middle NC pins 116 shown in FIGS. 3A-3C and FIGS. 5A-5C are not connected to the PCB traces 12b. The FPC 16 has a plurality of FPC traces 200b, and the FPC pads 200a respectively contacting the middle NC pins 116 are not connected to each other through the FPC traces 200b. Moreover, in the present embodiment, the FPC pads 200a respectively contacting the side NC pins 118 shown in FIGS. 5A-5C are not connected to each other through the FPC traces 200b. Similarly, the PCB pads 12a connecting the side NC pins 118 are not connected to the PCB traces 12b. Therefore, the middle NC pin 116 or the side NC pin 118 is electrically floating and as a floating pin.

In summary, in the invention, the at least one NC pin is added between the pair of differential pins and/or between the differential pin and the ground pin adjacent thereto so as to increase a distance between each of the pair of the differential pins and/or between the differential pin and the ground pin, and thus a differential characteristic impedance of the pair of differential pins is raised to reduce the impact of impedance mismatch.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A pin arrangement, adapted to a flexible printed circuit connector, the pin arrangement comprising:
   a pin lane, comprising:
      a pair of ground pins;
      a pair of differential pins, located between the pair of ground pins;
      at least one middle not-connected pin, located between the pair of differential pins; and
      a pair of side not-connected pins, wherein each of the pair of the side not-connected pins is located between one of the pair of ground pins and one of the pair of differential pins adjacent thereto and is not located between the pair of differential pins.

2. The pin arrangement as claimed in claim 1, wherein the at least one middle not-connected pin is a floating pin.

3. The pin arrangement as claimed in claim 1, wherein the pair of side not-connected pins are floating pins.

4. The pin arrangement as claimed in claim 1, wherein the pair of differential pins is adopt to USB, SATA, HDMI, PCIE or DP.

5. The pin arrangement as claimed in claim 1, further comprising:
   another pin lane, comprising:
      another pair of ground pins; and
      another pair of differential pins, located between the another pair of ground pins.

6. The pin arrangement as claimed in claim 5, wherein the another pin lane further comprises:
   another at least one middle not-connected pin, located between the another pair of differential pins.

7. The pin arrangement as claimed in claim 5, wherein the another pin lane further comprises:
   another pair of side not-connected pins, wherein each of the another pair of the side not-connected pins is located between one of the another pair of ground pins and one of the another pair of differential pins adjacent thereto, and is not located between the another pair of differential pins.

8. An electronic assembly, comprising:
   two printed circuit boards;
   two flexible printed circuit connectors, respectively mounted on the printed circuit boards; and
   a flexible printed circuit, having two contact portions respectively connected to the flexible printed circuit connectors, so as to electrically connect the flexible printed circuit connectors,
   wherein each of the flexible printed circuit connectors has a pin arrangement, and the pin arrangement comprises:
      a pin lane, comprising:
         a pair of ground pins;
         a pair of differential pins, located between the pair of ground pins;
         at least one middle not-connected pin, located between the pair of differential pins; and
         a pair of side not-connected pins, wherein each of the pair of the side not-connected pins is located between one of the pair of ground pins and one of the pair of differential pins adjacent thereto and is not located between the pair of differential pins.

9. The electronic assembly as claimed in claim 8, wherein the flexible printed circuit has a plurality of flexible printed circuit traces and a plurality of flexible printed circuit pads, and the flexible printed circuit pads respectively contacting the at least one middle not-connected pins are not connected to each other through the flexible printed circuit traces.

10. The electronic assembly as claimed in claim 8, wherein the printed circuit board has a plurality of printed circuit board pads and a plurality of printed circuit board traces, and the printed circuit board pad connecting to the at least one middle not-connected pin is not connected to the printed circuit board traces.

11. The electronic assembly as claimed in claim 8, wherein the flexible printed circuit has a plurality of flexible printed circuit traces and a plurality of flexible printed circuit pads, and the flexible printed circuit pads respectively contacting the side not-connected pins are not connected to each other through the flexible printed circuit traces.

12. The electronic assembly as claimed in claim 8, wherein the printed circuit board has a plurality of printed circuit board pads and a plurality of printed circuit board traces, and the printed circuit board pad connecting to the side not-connected pin is not connected to the printed circuit board traces.

13. The electronic assembly as claimed in claim 8, further comprising:
   another pin lane, comprising:
      another pair of ground pins; and
      another pair of differential pins, located between the another pair of ground pins.

14. The electronic assembly as claimed in claim 13, wherein the another pin lane further comprises:
   another at least one middle not-connected pin, located between the another pair of differential pins.

15. The electronic assembly as claimed in claim 13, wherein the another pin lane further comprises:
   another pair of side not-connected pins, wherein each of the another pair of the side not-connected pins is located between one of the another pair of ground pins and one of the another pair of differential pins adjacent thereto and is not located between the another pair of differential pins.

16. A pin arrangement, adapted to a flexible printed circuit connector, the pin arrangement comprising:
   a pin lane, comprising:
      a pair of ground pins;
      a pair of differential pins, located between the pair of ground pins; and
      at least one not-connected pin, located between one of the pair of ground pins and one of the pair of differential pins adjacent thereto, and not located between the pair of differential pins.

17. The pin arrangement as claimed in claim 16, wherein the at least one not-connected pin is a floating pin.

18. The pin arrangement as claimed in claim 16, wherein the pair of differential pins is adopt to USB, SATA, HDMI, PCIE or DP.

* * * * *